United States Patent
Luong et al.

(10) Patent No.: US 7,592,811 B2
(45) Date of Patent: Sep. 22, 2009

(54) HIGH-FREQUENCY RESONANT CAVITY FOR NUCLEAR MAGNETIC RESONANCE, USING RADIO-FREQUENCY TRANSMISSION LINES

(75) Inventors: Michel Luong, Villeneuve Saint Georges (FR); Xavier Hanus, Paris (FR); Michel Desmons, Montigny-le-Bretonneux (FR); Franck Lethimonier, La Ferte Alais (FR); Eric Giacomini, Rochefort-en-Yvelines (FR)

(73) Assignee: Commissariat a l'Energie Atomique, Paris (FR)

( * ) Notice: Subject to any disclaimer, the term of this patent is extended or adjusted under 35 U.S.C. 154(b) by 320 days.

(21) Appl. No.: 10/588,512

(22) PCT Filed: Feb. 4, 2005

(86) PCT No.: PCT/FR2005/050067

§ 371 (c)(1),
(2), (4) Date: Jan. 11, 2007

(87) PCT Pub. No.: WO2005/076028

PCT Pub. Date: Aug. 18, 2005

(65) Prior Publication Data

US 2007/0132529 A1    Jun. 14, 2007

(30) Foreign Application Priority Data

Feb. 6, 2004    (FR) .................................... 04 50218

(51) Int. Cl.
*G01V 3/00*    (2006.01)

(52) U.S. Cl. ....................................... 324/318; 324/322

(58) Field of Classification Search ................. 324/318, 324/322
See application file for complete search history.

(56) References Cited

U.S. PATENT DOCUMENTS

| 2,912,695 | A |   | 11/1959 | Cutler |
| 4,694,255 | A | * | 9/1987  | Hayes ........................ 324/318 |
| 4,746,866 | A |   | 5/1988  | Roeschmann |
| 4,751,464 | A |   | 6/1988  | Bridges |
| 5,557,247 | A |   | 9/1996  | Vaughn, Jr. |

(Continued)

FOREIGN PATENT DOCUMENTS

EP        0 366 188        5/1990

(Continued)

OTHER PUBLICATIONS

Wen, Han et al., "The Design and Test of a New Volume Coil for High Filed Imaging", 8306 Magnetic Resonance in Medicine, vol. 32, No. 4, pp. 492-498, 1994.

(Continued)

*Primary Examiner*—Louis M Arana
(74) *Attorney, Agent, or Firm*—Oblon, Spivak, McClelland, Maier & Neustadt, L.L.P.

(57) ABSTRACT

A high frequency cavity resonator for nuclear magnetic resonance, including: a set of transmission lines; and a shield surrounding these transmission lines, wherein each of these transmission lines includes a straight bar which is divided into elongated cylindrical segments, these segments being or being made electrically conducting, the bar being provided with thin solid dielectric elements inserted between the segments.

19 Claims, 11 Drawing Sheets

U.S. PATENT DOCUMENTS

| | | | |
|---|---|---|---|
| 5,886,596 A * | 3/1999 | Vaughan, Jr. | 333/219 |
| 6,590,393 B2 * | 7/2003 | Vaughn et al. | 324/318 |
| 7,202,668 B2 * | 4/2007 | Ludwig et al. | 324/318 |
| 2005/0174201 A1 | 8/2005 | Luong et al. | |

FOREIGN PATENT DOCUMENTS

| | | |
|---|---|---|
| FR | 2 183 700 | 12/1973 |
| JP | 5503268 | 1/1980 |
| JP | 2 84938 | 3/1990 |

OTHER PUBLICATIONS

Tian, J. et al., "Frequency Limits and Radiation Resistance for Volume Coils", Proc. Intl. Soc. Mag. Reson. Med., vol. 11, pp. 2354, 2003.

* cited by examiner

HIGH-FREQUENCY RESONANT CAVITY FOR NUCLEAR MAGNETIC RESONANCE, USING RADIO-FREQUENCY TRANSMISSION LINES

TECHNICAL FIELD

This invention relates to a high frequency cavity resonator, more particularly a high frequency cavity resonator type antenna, using radio frequency transmission lines, these transmission lines preferably being tuneable.

The invention is particularly applicable to NMR (Nuclear Magnetic Resonance) devices, and specifically devices intended for biological and medical examinations.

This high frequency cavity resonator is used to generate a B1 field, which is a high frequency electromagnetic field, or radio frequency (RF) field, with a magnetic component, in order to excite the nuclei of the atoms studied, in other words all atoms that can be detected by NMR, that are located in the object being examined, placed in the cavity, then to pick up the very weak radio frequency field resulting from the NMR phenomenon.

This cavity resonator was designed to more particularly excite and pick up the signal from the hydrogen atom proton.

This high frequency cavity resonator can be used in the NMR (Nuclear Magnetic Resonance) field, particularly to examine the head of a subject by MRI (Magnetic Resonance Imaging), but also in the MRS (Magnetic Resonance Spectroscopy) field.

STATE OF PRIOR ART

A bird cage type shielded high frequency cavity resonator comprises:
   a set of transmission lines,
   a shield that surrounds this set of transmission lines, and
   one or several loops that are inserted between the set of transmission lines and the shield and that will be used for radio frequency excitation of the cavity resonator and detection of NMR signals.

Concerning this subject, reference is made to the following documents:
   [1] U.S. Pat. No. 4,746,866 (Röschmann)
   [2] U.S. Pat. No. 4,751,464 (Bridges)
   [3] U.S. Pat. No. 5,557,247 (Vaughn, Jr.)
   [4] Proc. Int. Soc. Mag. Res. Med. 11, 2003, No. 2354 (Vaughn).

These documents essentially concern improvements made to transmission lines of a cavity resonator, taken individually or together.

In the devices described in the documents mentioned above, means of tuning each transmission line to the required working frequency are usually formed by mechanical means for adjusting the electromagnetic coupling between the transmission lines and the shield.

Thus, document [1] discloses a coil that will be used in an MRI device and is formed of transmission lines that are similar to coaxial cables: each of these lines comprises an external hollow conducting cylinder containing an internal hollow cylinder made from a dielectric material and inside which two central conductors are placed, at least one of these conductors being mobile in the axial direction.

An external shield is coupled to the central conductors through the ends of the external cylinder, through sliding contacts.

Mechanical displacement of the mobile central conductor has the effect of modifying the capacitance of the transmission line, enabling an adjustment of the resonant frequency. However, in document [1], the external conductor of the bar, formed by a coaxial line, has no dielectric discontinuity.

Document [2] describes a cavity resonator in which transmission lines are formed from segments of conducting strips, between which sections made from a dielectric material are inserted. An external shield is coupled to the transmission lines through capacitances located at the ends of each transmission line. The cavity resonator is tuned by means of adjustable slots formed in the external shield. In document [2], the "bars" have the shape of strips whose cross section is rectangular. Besides, in document [2], the main surface of the dielectric elements is parallel to the bar axis. The bars (or strips) are fixed and do not make an adjustment possible. Lastly, the connection of a bar with the envelope that the cavity resonate has is electrically insulating.

Document [3] uses transmission lines of the type disclosed in document [1] to form a bird cage type cavity resonator. This document also describes a mechanical system for simultaneously tuning several transmission lines.

Cavity resonators known according to the documents mentioned above have the disadvantage that they do not work satisfactorily at high values of the magnetic field, of the order of 9 T or more, and/or at high frequencies of the order of 400 MHz or more, in order to increase the signal/noise ratio.

For example, experiments and a numerical simulation of the resonator described in document [4] using the finite element method, show that this type of resonator is limited to resonant frequencies of the proton (Larmor frequencies) less than about 400 MHz, or to magnetic fields less than 4 Teslas, for cylindrical volumes 27 cm in diameter and 25 cm long, suitable for containing the head of a subject.

In order to increase the frequency, the central conductors of the transmission lines must be completely withdrawn, which causes losses by radiation and poor uniformity of the field B1 produced.

PRESENTATION OF THE INVENTION

This invention relates to a high frequency cavity resonator which does not have the disadvantages of known cavity resonators mentioned above.

A cavity resonator according to the invention is an improvement to known cavity resonators, due to the use of transmission lines with an innovative structure and the combination of these transmission lines with the shield of the cavity.

Numerical simulation techniques are particularly suitable for this type of invention, and are used to optimize the parameters of this cavity resonator.

The invention also proposes a tuning system that may be provided on the transmission lines.

One essential aspect of the invention is in the structure of the transmission lines, this structure being different from the structure being used in documents [1]-[3]. In the invention, a transmission line is neither a coaxial structure of conducting materials alternating with dielectric materials nor a structure of strips having a rectangular cross section: in the invention it is a straight and segmented bar that is (or is made) electrically conducting and provided with thin dielectric elements inserted between the cylindrical and conducting segments of the bar.

Admittedly, similar principles are used in the field of traveling wave particle accelerators, but the structures which are the subject matter of this invention are quite innovative in the NMR field, which is quite remote from the field mentioned above.

The thickness of dielectric elements and the material from which they are made, the number of these elements per transmission line, and the number of such lines in the cavity resonator are adjusted using a numerical simulation, in order to optimize the parameters of the cavity resonator (particularly the quality factor, the working frequency and the field uniformity) and to obtain a set of lines with dimensions compatible with the volume of the cavity resonator.

Furthermore, the working frequency of the cavity may be fine-tuned by modifying the thickness of the dielectric elements, for example by deforming them.

Moreover, instead of being a simple cylinder closed at one end and provided with an opening at the other end to enable an object (particularly the head of a subject) to be inserted into the cavity resonator, the shield may include a re-entrant cylindrical section at the opening.

This type of section can advantageously reduce losses of electromagnetic energy by radiation at the opening and limits disturbances of the cavity resonator by the object, particularly the head.

A cavity resonator could be designed according to the invention capable of operating at a magnetic field of 11.7 T at 500 MHz, with a uniformity per unit volume better than 5% over a 190 mm diameter cylindrical volume, equivalent to a head.

Moreover, transmission lines with the innovative structure mentioned above can be used in fields other than MRI, for example MRS.

Specifically, the purpose of this invention is a high frequency cavity resonator for nuclear magnetic resonance, comprising a set of transmission lines and a shield surrounding these transmission lines, characterized in that each of these transmission lines comprises a straight bar which is divided into elongated cylindrical segments, these segments being or being made electrically conducting, the bar being provided with thin dielectric elements inserted between the segments.

The length of the cylindrical segments is thus much higher than the length of the electrically insulating intervals where the dielectric elements with low thickness are inserted. The diameter of the conducting segments is preferably much smaller than the working wavelength.

Preferably, the cylindrical segments are made from a dielectric material whose external surface is made electrically conducting.

Preferably the cylindrical segments, and the dielectric elements of the same bar substantially have the same diameter.

Preferably, the lengths of the various conductive cylindrical segments of the same bar are different and are calculated in order to obtain the best homogeneousness of the field at the center of the cavity resonator. For example, a bar successively comprises segments whose respective lengths are 50 mm, 14 mm, 44 mm, 60 mm, 44 mm, 14 mm and 50 mm.

According to one preferred embodiment of the transmission line according to the invention, this line is provided with frequency tuning means, these tuning means being capable of modifying the thickness of the dielectric elements.

Preferably, the dielectric elements are elastically deformable.

Preferably, the thin dielectric elements have a substantially circular cross section.

Preferably, the dielectric elements have a main surface which is substantially perpendicular to the bar axis.

According to one preferred embodiment of the invention, the segments and dielectric elements comprise drillings, each transmission line also comprising straight dielectric connecting parts that pass through the drillings and on which the segments and dielectric elements can slide.

The transmission lines (or bars) are preferably substantially parallel and uniformly distributed on a cylindrical surface.

The high frequency cavity resonator may comprise two ends, one of which is open and the other is closed. The shield of the cavity resonator may have a cylindrical structure.

In both cases, the shield may comprise a re-entrant part on the open end of the cavity resonator.

According to a particular embodiment of the invention, an electrically conductive connection is established between each bar and the shield.

The cavity resonator which is the object of the invention can be used in magnetic resonance imaging as a transmitting or receiving system. It can also be used in the field of Magnetic Resonance Spectroscopy as a transmitting or receiving system.

This invention also relates to a nuclear magnetic resonance device comprising a high frequency cavity resonator according to the invention.

It also relates to a multiple conductor wave guide constituted of a transmission line which is connected with a set of transmission lines, or elementary conductors, characterized in that these elementary conductors are placed on a cylinder and in that the axes of these elementary conductors are substantially parallel to the cylinder axis, and in that each of these transmission lines, or elementary conductors, comprises a rectilinear bar which is divided into elongated cylindrical segments, these segments being or being made electrically conductive, the bar being provided with thin dielectric elements which are inserted between the segments, the set of elementary conductors being conductively connected with a shield which surrounds this set.

BRIEF DESCRIPTION OF THE DRAWINGS

This invention will be better understood after reading the description of example embodiments given below, for guidance purposes only and in no way restrictive, with reference to the appended drawings among which.

DETAILED PRESENTATION OF PARTICULAR EMBODIMENTS

The manufacture of a high frequency cavity resonator, also called a volume RF coil, designed to examine the head of a subject by NMR, becomes critical when the effective wavelength of the RF field becomes close to the size of the sample (head). The working frequency of the cavity resonator must be adjusted to the Larmor frequency that is proportional to the intensity of the longitudinal and static magnetic field (usually denoted B0) of the MRI apparatus.

In one particular embodiment, the invention will be used by an MRI system operating at 11.7 T. Consequently, the Larmor frequency is 500 MHz for the nucleus studied by MRI, in the event the proton of the hydrogen atom.

Within this frequency range, electromagnetic losses by radiation and in the sample increase and consequently degrade the quality factor of the cavity resonator and the uniformity of the transverse field B1. The design of an RF coil according to the invention must satisfy two requirements, namely keeping acceptable quality factor and uniformity of transverse field B1.

This invention proposes a new design of a cavity resonator that can operate at and above 500 MHz (these values being given as examples, but other values are possible).

This design must satisfy a strong dimensional constraint imposed by the manufacture of the coil that generates the field B0 in the MRI system and by the manufacture of gradient coils which are other essential components of the MRI.

In one example, the diameter of the volume RF coil is limited to about 350 mm, and its length is limited to about 300 mm.

The basic principle of the design of a cavity resonator according to the invention consists of making a $\lambda/2$ or $\lambda/4$ type cavity resonator from a transmission line. The constraint on the transverse dimension and the operating frequency makes it absolutely impossible to use a line with a single conductor, regardless of the geometry of its section, due to the cutoff frequency. Thus, the choice of a line with multiple conductors is unavoidable.

Figure 1:
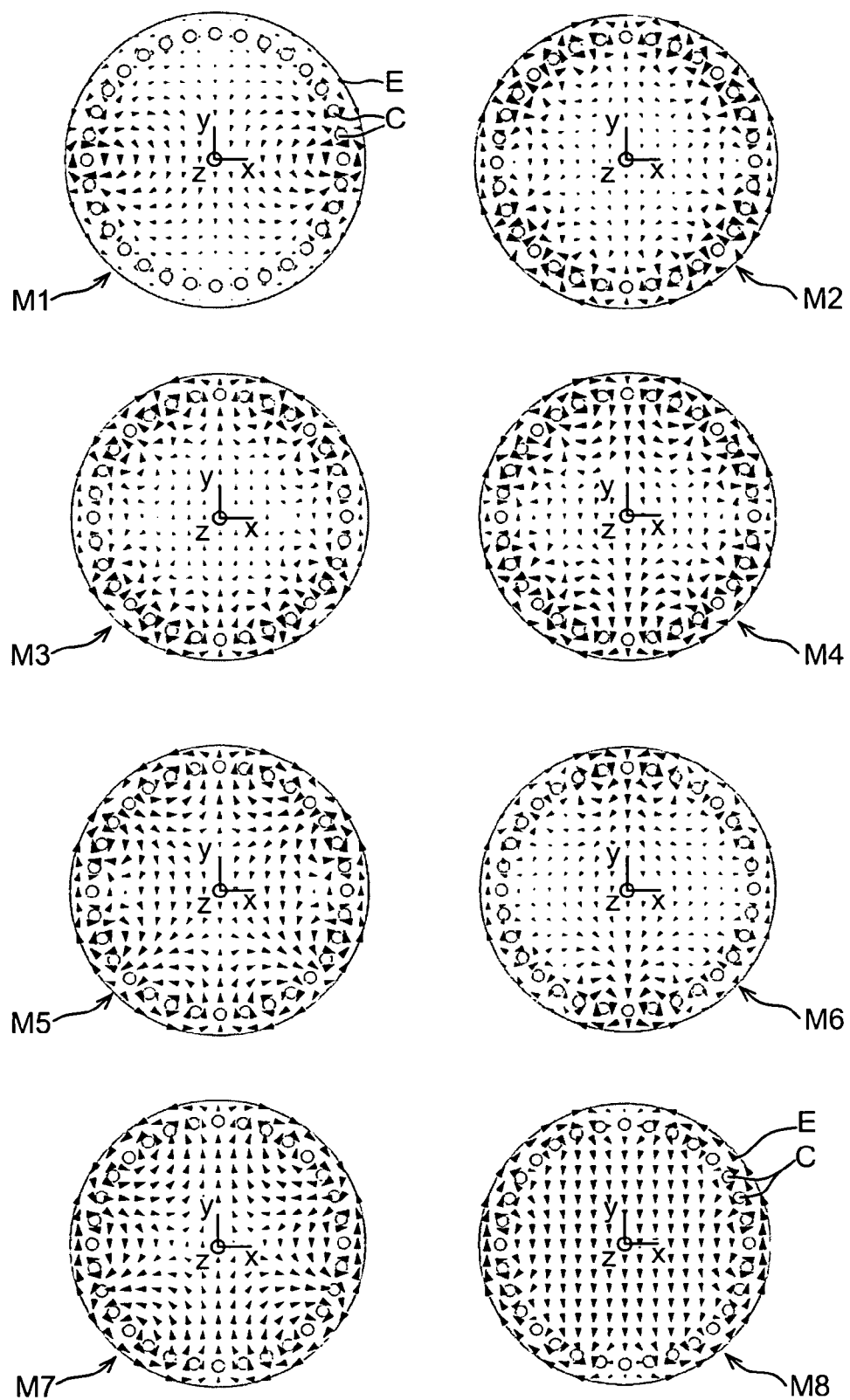
FIG. 1 is a diagrammatic cross-sectional view showing the geometry of a wave guide with multiple conductors according to the invention, and also illustrates propagation modes of electromagnetic waves in this guide, FIGS. 2A and 2B diagrammatically show a longitudinal section (FIG. 2A) and a cross-section (FIG. 2B) illustrating an example antenna or cavity resonator according to the invention, for the numerical simulation, FIGS. 3A and 3B diagrammatically show a cross-section (FIG. 3A) and a longitudinal section (FIG. 3B) illustrating the transverse magnetic field B1 at 500 MHz in the example antenna in FIGS. 2A and 2B, FIGS. 4A, 4B and 4C diagrammatically illustrate a cross-section (FIG. 4A) and a longitudinal section along two orthogonal planes (FIGS. 4B and 4C), showing curves of the amplitude of field B1 in linear polarization.

Considering the geometry of the other components of the system (gradient coils and coil creating the field B0) and the geometry of the sample (head), the choice is specifically a line comprising a cylindrical conducting envelope E (see FIG. 1), for which the axis is marked reference z in FIG. 1, this envelope (shield) surrounds several other conductors C (or straight conducting bars) that are parallel to the z axis and are uniformly distributed on a cylinder (geometrically), for which the axis is also the z axis. In FIG. 1, the x and y references represent axes that are orthogonal to each other and to the z-axis.

The analysis of TEM type propagation modes as a function of the number of conductors C and the dimension and position of these conductors relative to the envelope E, is the subject of research specific to this invention in order to create the most uniform possible B1 field distribution in a transverse direction by superposing several modes (since all TEM modes have the same propagation constant).

There is no known analytic approach for defining these parameters (number of conductors and the size and position of these conductors with respect to the envelope).

The only way to obtain the parameters of a cavity resonator conforming with the invention, and particularly all appropriate parameters for the section of a transmission line, is to perform a numerical simulation study specific to this invention. These parameters are:

diameter of the outer envelope E: 344 mm,
diameter of the inner conductors C: 14 mm, and
position of these conductors C with respect to the z axis of the cavity: 147 mm.

Each of these parameters can be varied within an interval with an amplitude of the order of 0.5 mm centered on the corresponding value given above, without significantly modifying the distribution of the field of propagation modes.

The principle of the simulation to obtain appropriate parameters consists of systematically studying the magnetic field distribution for all modes in which the field is parallel to the y axis (FIG. 1). This is done by applying a search algorithm for proper modes on the section of the guide in two dimensions, with an electrical boundary condition along the y axis and a magnetic boundary condition along the x axis. This model is equivalent to an excitation of the guide (cavity) by a magnetic coupling loop, for example located at the +x abscissa between the envelope E and one of the conductors C, and for which the surface is perpendicular to the y axis. Eight propagation modes are thus obtained, denoted M1, M2, . . . , M8, and they are diagrammatically illustrated in FIG. 1.

When the dimensions of the guide elements are not correctly determined, the constructive and destructive superposition of the modes produces a very non-homogenous magnetic field distribution.

In FIG. 1, modes M1, M7 and M8 are preferably excited by the loop. Since the useful mode is mode M8, the geometry was determined such that superposition of modes M1 and M7 does not deteriorate its uniformity, but on the contrary tends to improve it.

The wavelength of TEM modes, which is 60 cm at 500 MHz, does not make it impossible to use the principle of a $\lambda/2$ resonator, which would be compatible with the constraint on the cavity length. However, the boundary conditions should be identical at both ends of the cavity, and one of these ends is necessarily open in the case of a coil designed to examine the head. But two openings would induce excessive radiation losses at 500 MHz and would drastically degrade the quality factor of the cavity resonator.

Therefore, the design preferably uses a $\lambda/4$ resonator. Considering the wavelength, this resonator would be only 150 mm long and the longitudinal uniformity of the field at the location of the sample (the head in the example considered) would become unacceptable.

According to this invention, a cavity resonator similar to a $\lambda/4$ resonator is proposed capable of resonating at 500 MHz and higher frequencies, while providing acceptable uniformity in the longitudinal direction (z) and in a transverse direction.

The authors of devices described in the various documents mentioned above use adjustable coaxial structures as multiple conductors. Each of these structures forms a variable distributed capacitance, due to the mobility of the internal conductor of the coaxial line formed by this structure. By increasing this capacitance, it was possible to obtain a cavity resonator having a very low resonant frequency equal to 170 MHz or less.

By removing internal conductors, the frequency of a cavity resonator of the type described in document [3] can be increased, the limiting case being the case in which the entire conductor is removed. The result is then a section similar to that shown in FIG. 1.

Considering the comments made about λ/2 and λ/4 resonators, it is easy to understand the reason why cavity resonators of the type mentioned in document [3] are not made for applications to MRI for man at frequencies higher than 400 MHz.

One innovative aspect of a cavity resonator according to this invention is the introduction of dielectric discontinuities on internal cylindrical conductors acting as discrete capacitances, in order to obtain an λ/4 type resonator, preferably over a length of 300 mm.

Thus, the invention uses a technique used in the field of particle accelerators, which is quite remote from the design of antennas and also from NMR applications.

In traveling wave accelerating structures, obstacles such as perforated disks distributed regularly along a circular wave guide are used to reduce the phase velocity and to create pass bands and stop bands. The propagation wavelength in pass bands is higher when a stop band is approached.

However, the efficiency of such an approach for volume RF coils is not obvious. Despite the obstacles, the propagation mode in accelerating structures remains a TM type mode.

Introduction of obstacles can severely disturb these modes in the case of a guide with multiple conductors in which degenerated modes are propagated.

The only way of validating this approach is to use an appropriate numerical program. This program must be capable of meshing a complex 3-dimensional structure comprising a large number of separate components. It can be used to calculate the resonant frequency of the antenna and the distribution of the electromagnetic field in 3 dimensions. A program based on the finite integrations method is suitable for such a study.

Figure 2A:
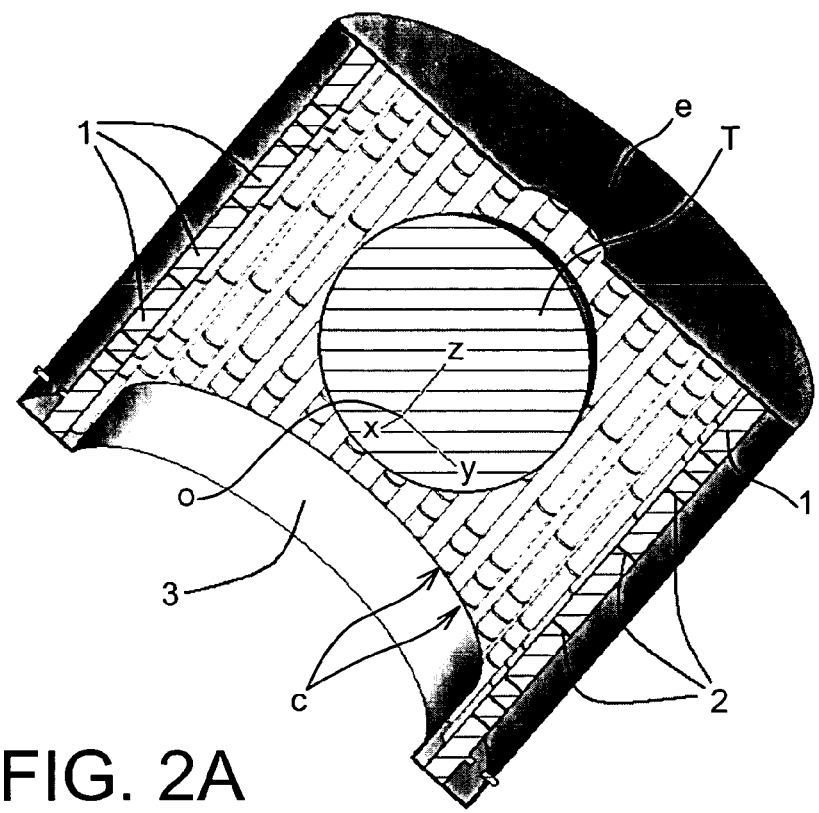
Figure 2B:
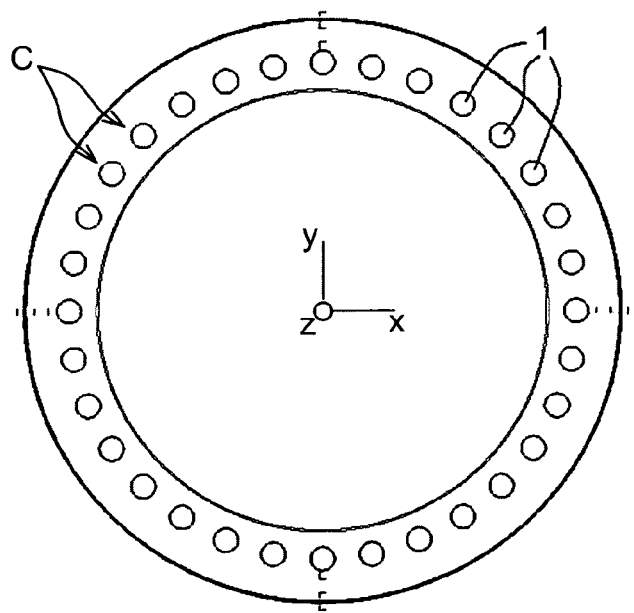

FIGS. 2A and 2B diagrammatically illustrate a model of an antenna conforming with the invention for numerical simulation for optimization of this antenna. The three orthogonal axes, x, y and z can once again be seen, where z is the longitudinal axis of the antenna. These three axes intersect at a point O at the center of the antenna. These notations will be kept throughout the remainder of the description.

In FIG. 2A, reference T denotes the area of interest for the NMR examination, this area being materialized by a sphere (sectional view).

The antenna, or cavity resonator, according to the invention comprises an electrically conducting envelope e (shield), one end of which is open and the other end of which is closed. The antenna also comprises internal electrical conductors c (or straight conducting bars) inside the envelope, these conductors being parallel to the z axis of the envelope.

As can be seen in FIGS. 2A and 2B, each internal conductor consists of bringing cylindrical elongated conducting segments 1 together in the axial direction, except that they are electrically insulated from each other by thin dielectric disks 2, each of which forming a gap for the conductors.

Another important advantage of the invention is related to the possibility of modulating the position of the intervals in a conductor along this conductor, to extend the uniformity of the field B1 in the longitudinal direction (z). The distance and the position of the intervals is optimized by making a 3-dimensional modeling and a large number of numerical simulations.

One example embodiment comprises 8 intervals per conductor, as shown in FIG. 2A. The spacing of the gaps may vary from 0.5 mm to 2 mm for a dielectric made from polyethylene. The dielectric disks are machined to a shape in which they can deform elastically, and the frequency of the cavity resonator can be tuned by taking simultaneous mechanical action on the set of conducting segments to compress these disks.

For example, the above-mentioned shape may be a convex disk or a spherical cap, or any other shape having a substantially circular section.

Finally, a 50 mm high metallic crown 3 has been formed on the side of the opening that the antenna has at one of its ends, in order to limit radiation and improve the quality factor of the antenna.

Figure 3A:
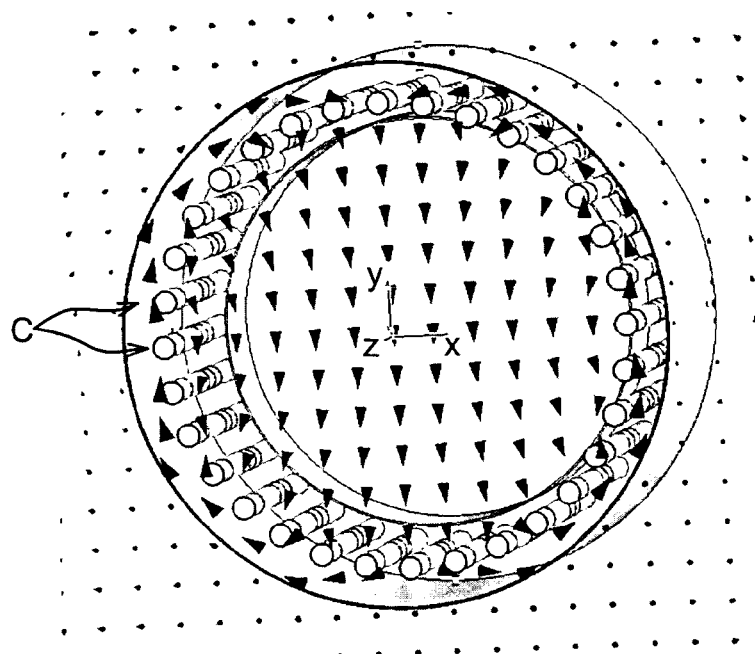
Figure 3B:
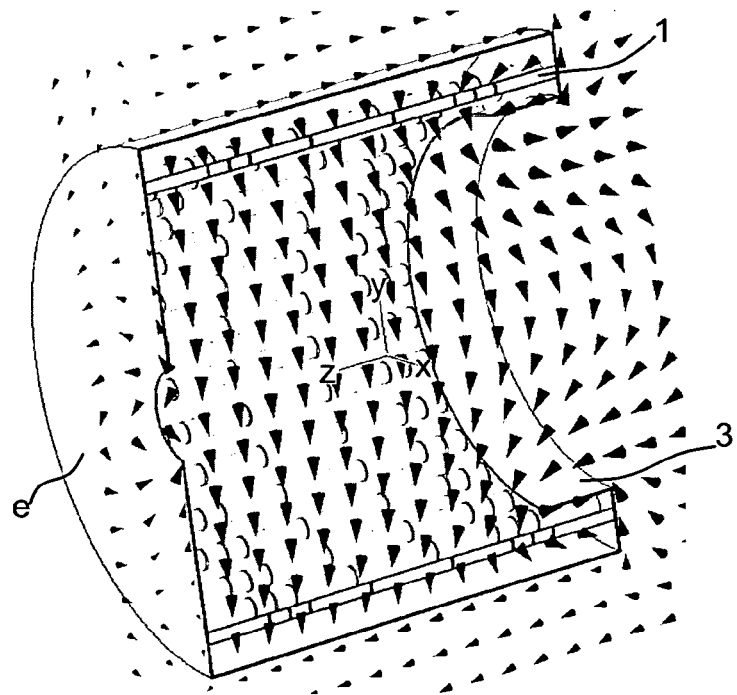

FIGS. 3A and 3B show that the structure of mode M8 in FIG. 1 was not changed by inserting the dielectric disks 2.

Figure 4A:
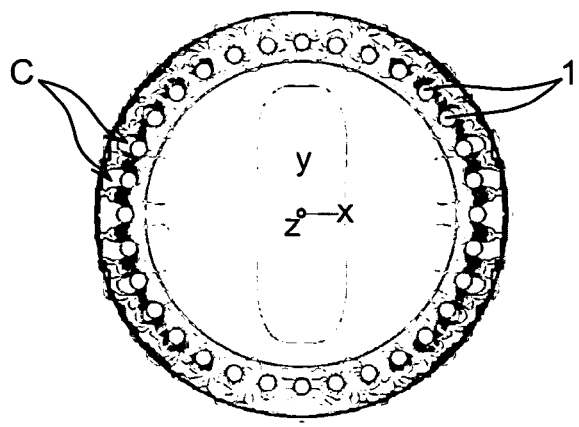
Figure 4B:
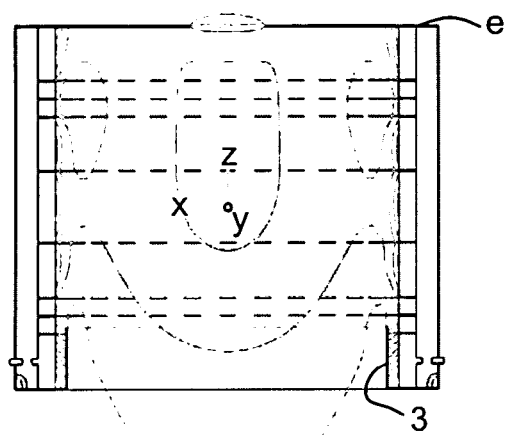
Figure 4C:
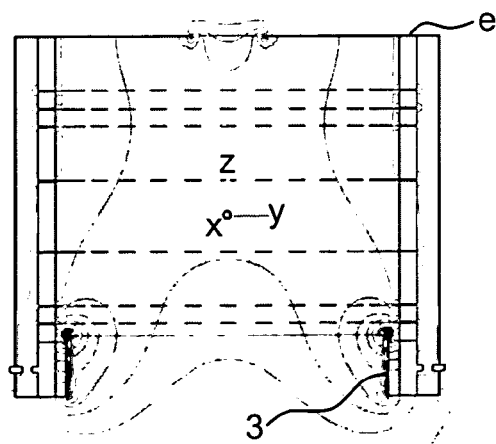
Figure 5:
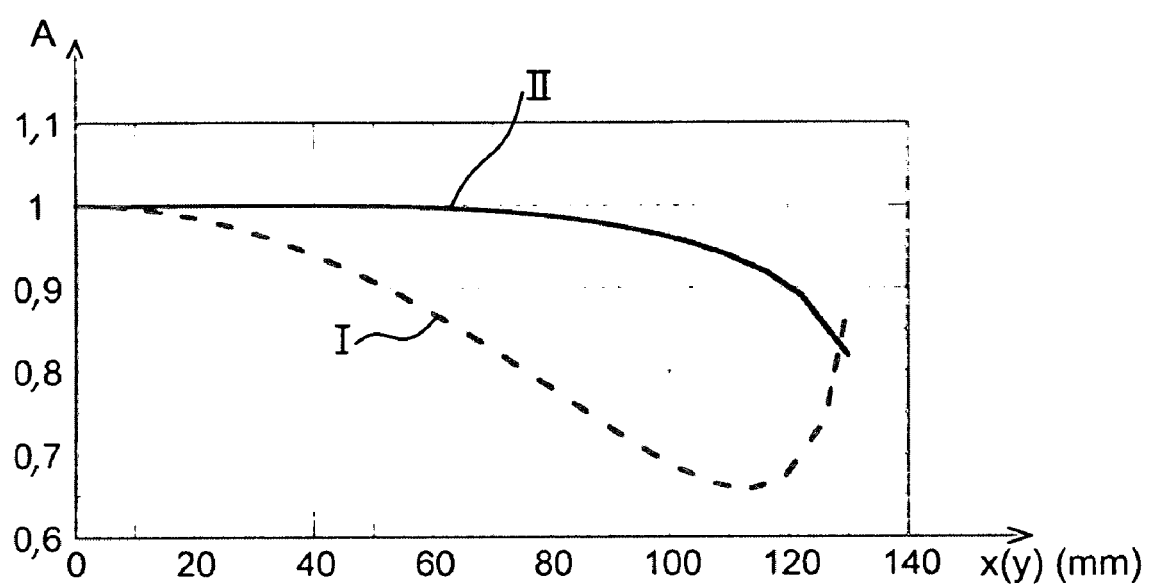
FIG. 5 illustrates variations of the normalized amplitude A of the field B1 along two orthogonal axes x (curve I) and y (curve II), at the center of the example antenna conforming with the invention, starting from the z axis of the antenna that is orthogonal to the x and y axes, with the x, y and z axes intersecting at point O, FIGS. 6A, 6B and 6C diagrammatically illustrate a cross-section (FIG. 6A) and a longitudinal section along two orthogonal planes (FIGS. 6B and 6C), showing curves of the amplitude of field B1 in circular polarization.
Figure 6A:
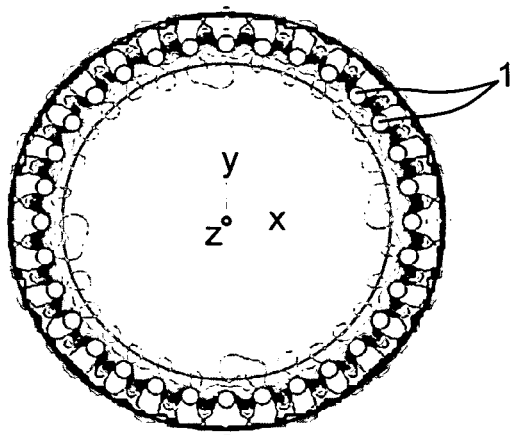
Figure 6B:
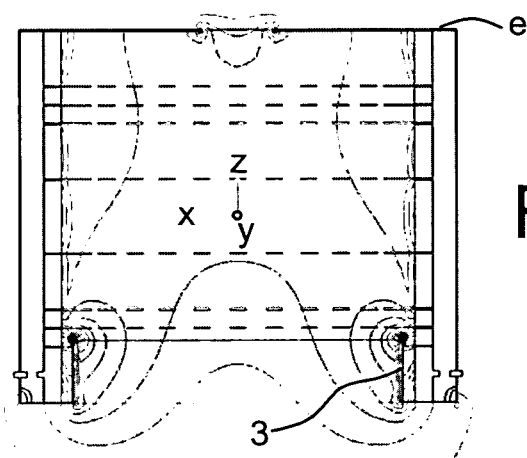
Figure 6C:
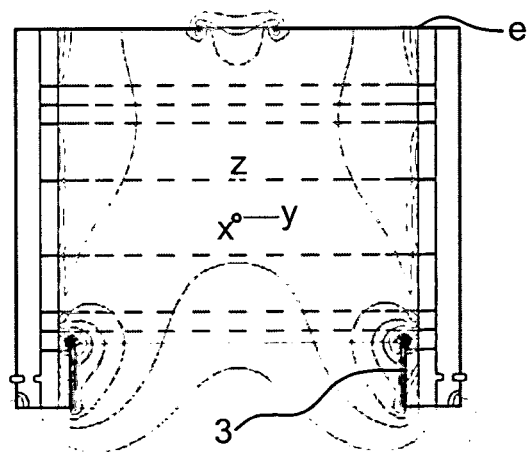

The uniformity of the field B1 can only be achieved in a single transverse direction (see FIGS. 4A to 4B and 5), consequently the cavity resonator according to the invention is used with circular polarization (see FIGS. 6A, 6B and 6C) by means of four excitation devices (not shown) which are placed at 90 degrees from each other at +x, −x, +y, −y, and form two pairs that are powered in quadrature using two power dividers and two hybrid circuits (not shown).

In the following, details are given about the structure and operation of an example antenna, or cavity resonator subject of the invention, with reference to FIGS. 7A, 7B, 8A, 8B, 9A, 9B, 10A, 10B, 11A and 11B. This antenna comprises electrical conducting elements forming elongated cylinders, and thin elements made from a dielectric material.

The effects of currents induced by gradient coils in the MRI apparatus in which the antenna will be installed, are minimized by making the conducting elements from elements made from a rigid dielectric material, for example high density polyethylene, and covered with a metallic layer very slightly thicker than the skin depth of the RF wave, taking account of the electrical conductivity, by CVD (chemical vapor deposition).

Figure 7A:
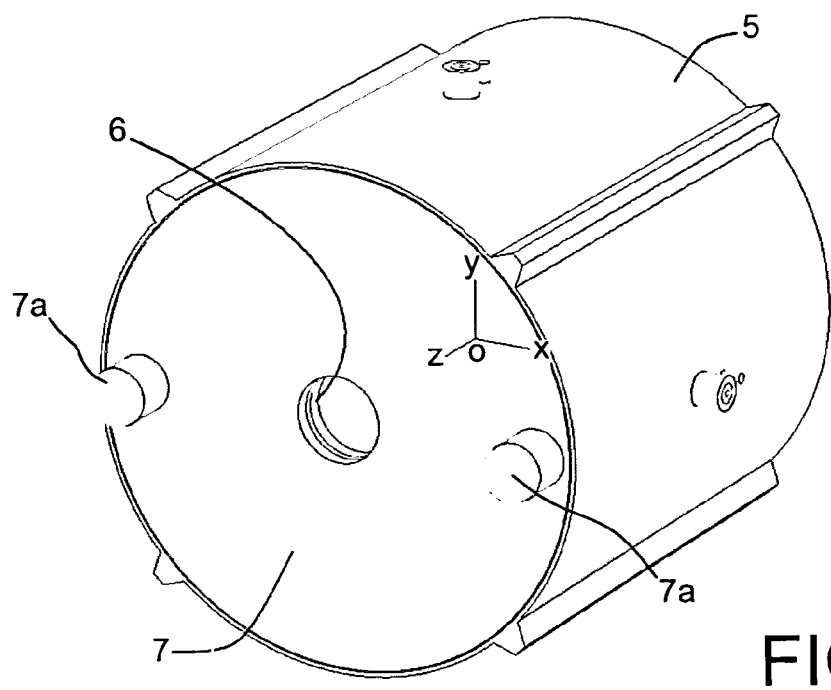
FIGS. 7A and 7B show a diagrammatic perspective view and a diagrammatic longitudinal sectional view of an example of an antenna according to the invention, in this case only 4 of the 42 bars in this antenna being shown.
Figure 7B:
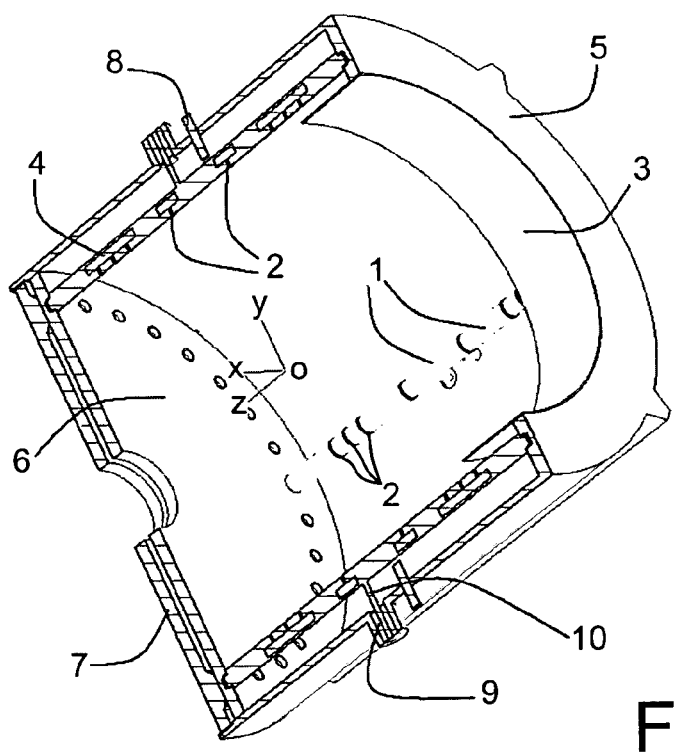
Figure 8A:
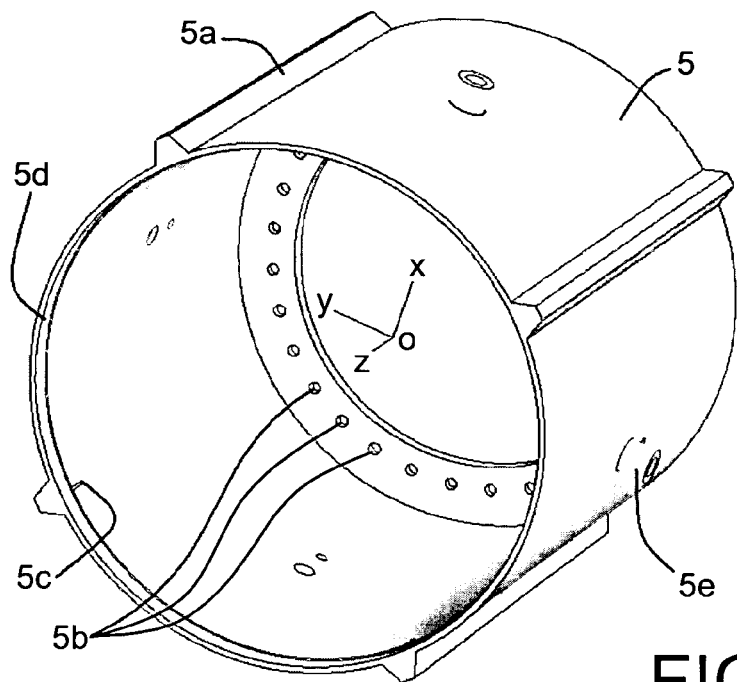
FIGS. 8A and 8B show a diagrammatic perspective view of the invention showing elements of the antenna in FIGS. 7A and 7B, provided with a metallic coating.
Figure 8B:
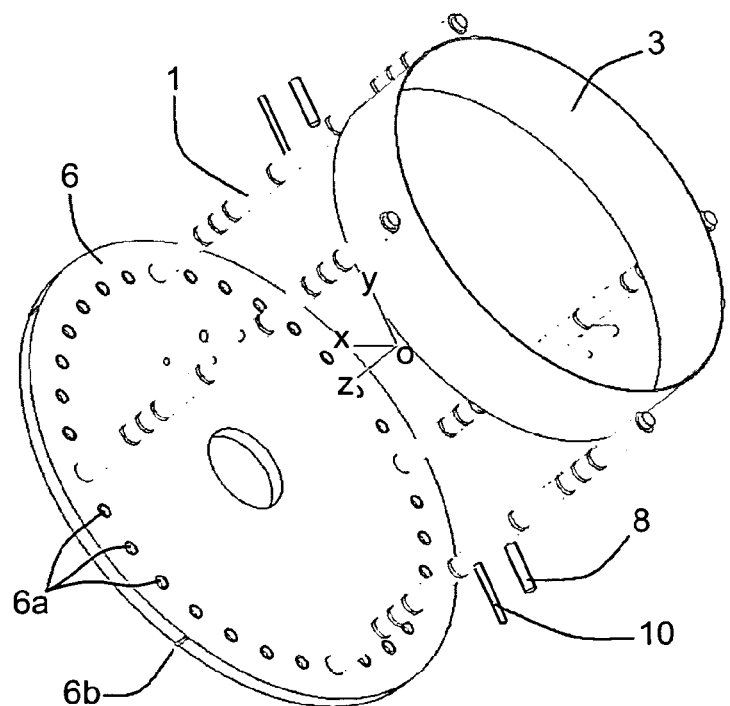
Figure 9A:
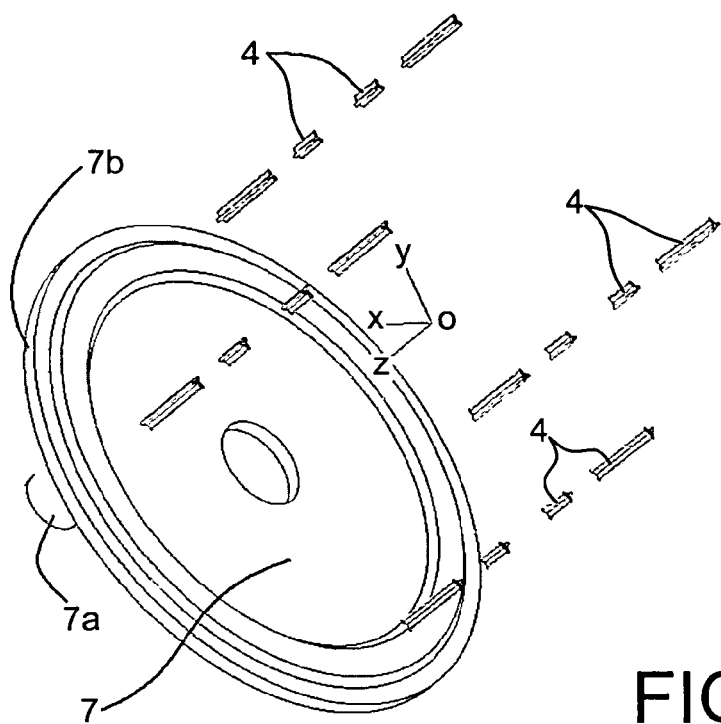
FIGS. 9A and 9B are diagrammatic perspective views of dielectric elements of this antenna.
Figure 9B:
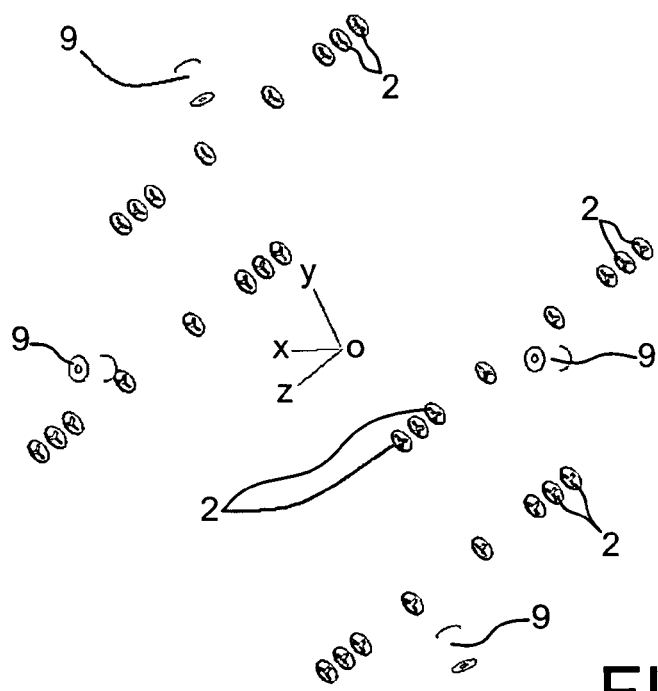
Figure 10A:
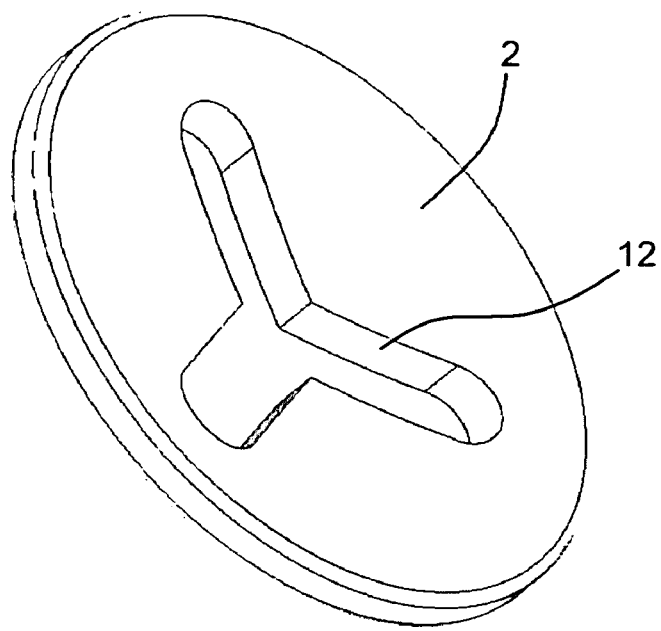
FIGS. 10A and 10B are diagrammatic perspective views of a deformable disk (FIG. 10A) and a connecting part (FIG. 10B) used in this antenna.
Figure 10B:
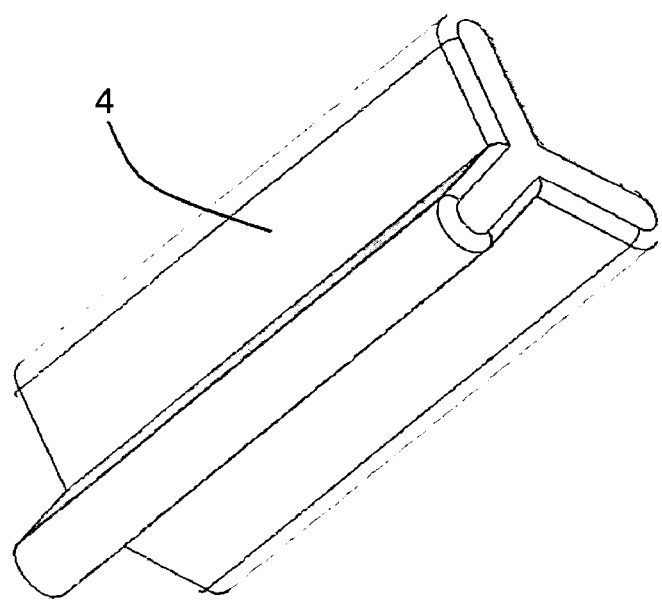
Figure 11A:
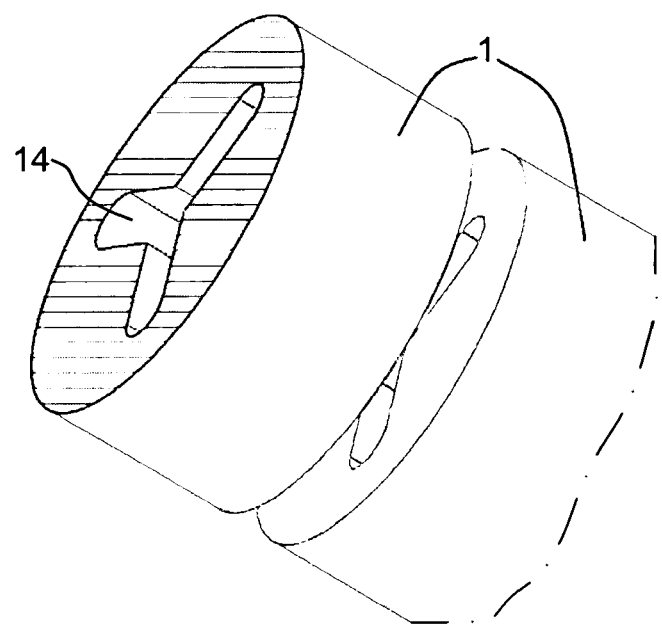
FIGS. 11A and 11B are diagrammatic perspective views of segments provided with a metallic coating and forming the bars of this antenna.
Figure 11B:
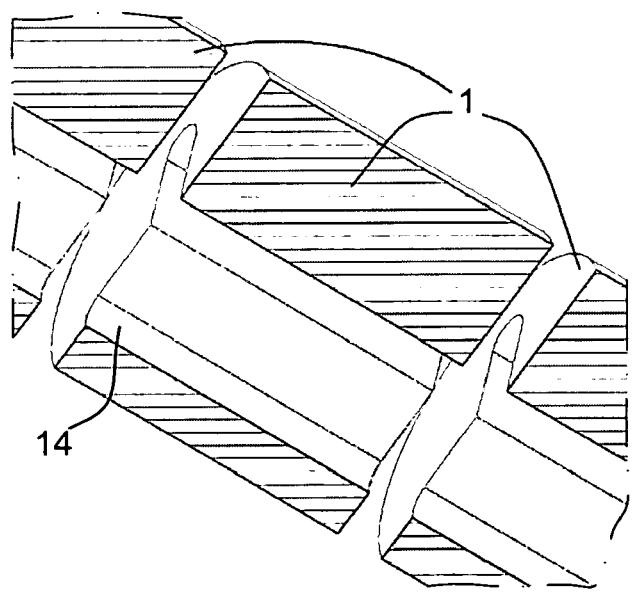

Remember that FIGS. 7A and 7B show an external view and a sectional view respectively of an example antenna according to the invention, only 4 of the 32 bars included in the example of this antenna being shown; FIGS. 8A and 8B shown the conducting elements of the antenna in the example (elements with metallic coating); FIGS. 9A and 9B show dielectric elements of this antenna; FIGS. 10A and 10B show a thin deformable disk and a segment connecting internal part respectively; and FIGS. 11A and 11B show cylindrical segments with metallic coating forming the bars of this antenna.

The conducting elements for the antenna are the body 5 of this antenna, the cylindrical segments 1 forming the bars of the antenna, a re-entrant ring or crown 3, a sliding disk 6 that closes one end of the antenna, internal conductors 10 in the coaxial coupling lines, and cylindrical plungers 8 that close the magnetic coupling loops formed by element references 8, 9 and 10—see FIGS. 7A, 7B, 8A and 8B.

Elements made of a dielectric material (not metallized) may be of two types, first a high stiffness for rotating disk 7 that enables frequency tuning of the antenna and for internal connecting parts 4, second a high elasticity for the convex disks or chips 2.

The re-entrant ring 3 that does not bear any mechanical force, may be glued on the body 5 of the antenna.

The segments 1 at the ends of each bar are screwed at one end onto the body 5 in threaded holes 5b provided for this purpose, and at the other end on the sliding disk 6, at the threaded holes 6a in this disk.

The other segments 1 are connected to each other by a connecting part 4, sandwiching a convex disk 2 to form a variable capacitance. The imprint of the connecting part in the segments must either pass through, or be longer than this connecting part. The resulting clearance makes it possible to compress the disk—see FIGS. 10A, 10B, 11A and 11B.

It can be seen that each disk 2 has a drilling 12, and each segment 1 has a drilling 14, through which the connecting part can pass.

Seen in section, the shape of this part and the shape of the drillings are the same (three branches at 120° from each other in the example), the size of the part being slightly smaller than the size of the drillings so that it can slide in these drillings.

Considering that the dielectric disks 2 were inserted so that the antenna can resonate at 500 MHz on a given length, it is easy to imagine a method that simultaneously modifies the capacitance of all gaps to tune the antenna.

This modification is made by varying either the size of the gap or the dielectric constant of the disk, or both. In the first case, the sensitivity given by a simulation is 144 MHz/mm for Teflon (registered trade mark) disks (for which the relative permittivity is equal to 2.1) whose thickness is substantially equal to 1 mm.

A sensitivity of 82 MHz per unit relative permittivity was obtained for a 1 mm gap, in the second case.

A combination of these two principles was adopted (see FIGS. 7A and 7B).

Each thin disk 2 made of a dielectric material with uniform thickness has a convex shape and can thus be compressed. It is drilled at its center by a pattern (see FIGS. 10A and 10B) corresponding to the section of a connecting part 4 with 3 arms, also made of a dielectric material but stiffer.

The two bar segments 1 on each side of the disk 2 must present a negative impression corresponding to the connecting part that either passes through or is longer (clearance). Thus, these parts form a capacitive gap that is made variable by segments compressing the disk without torsion.

Since the resonant frequency of the modes, and particularly dipole mode, reduces with the increase in the capacitance of the gaps, compression of the disk 2 combines two additive effects: reduction of the gap and the increase in the effective dielectric constant of the gap, both of which participate in increasing the capacitance and therefore in reducing the resonant frequency.

Compression is produced by displacing the sliding disk 6 on which the rotating disk 7 is supported, the edge of which comprises a thread 7b that is adapted onto the thread 5d of the antenna body.

Two handles 7a were installed on the rotating disk to facilitate handling. Displacement of the sliding disk 6 is guided by projections 6b formed on its edge and that fit into the grooves 5c (see FIGS. 8A and 8B) provided on the body 5 of the antenna along the alignment of the stiffeners 5a.

These stiffeners are necessary due to the fact that the thickness of the sidewall of the body 5 is limited to 5 mm by the construction of the gradient coils. Nevertheless, this construction does enable the formation of stiffeners at specific locations due to the fact that the coils are composed of cylindrical elements arranged on a circle that leaves interstices in which the stiffeners 5a can be housed.

The antenna power supply in quadrature is made using four coaxial inputs whose outer conductor 5e is fixed to the body of the antenna 5. The internal conductor is connected to a segment 1 of a bar (see FIG. 7) and is insulated from the external conductor by an electrically insulating sleeve 9.

The characteristic impedance of the line was chosen to be equal to 50 ohms.

The dimensions of the line were increased more than would be necessary to transport the average RF power and the peak RF power, in order to maintain a reasonable mesh ratio and satisfactory calculation precision for coupling.

The inside and outside diameters of the line are 4.2 mm and 14 mm respectively.

A 7 mm diameter cylindrical plunger 8 (i.e. a conducting element or an element made conducting that penetrates into the antenna at the gap between the envelope E and conductors C), with an axis at a variable distance LC from the axis of the internal conductor 10, closes the magnetic coupling loop through a 1.4 mm capacitive gap.

This coupling method covers a range of external quality factors from 500 to 50, by varying LC from 20 mm to 55 mm. It also has the advantage that it does not modify the resonant frequency on this range. The capacitive gap between the plunger and the bar only causes a very slight variation of the coupling coefficient for values of between 1 mm and 2 mm.

Finally, the two diametrically opposite inputs form a pair powered in phase by an RF source (not shown) and the two other inputs located at 90 degrees from the first two, form a second pair that is powered in quadrature (90 degree phase shift) with respect to the first pair.

The invention advantageously implements conductive bars whose cylindrical structure makes it possible for the magnetic field lines to better bypass each bar and thus makes it possible to obtain a more homogeneous distribution of the magnetic field in the central area of the cavity resonator. This bypassing results from the boundary conditions which are imposed by the bars to the high frequency electromagnetic wave. Considering the Maxwell equations, the field lines more easily bypass a bar having a circular section than a stripe which has a flat rectangular section (like the bar which is described in U.S. Pat. No. 4,751,464).

In practice, the geometry of the bars also limits their number (16 in U.S. Pat. No. 4,751,464) in a given volume for a resonator which is intended for MRI, whereas there are 32 bars according to one of the described preferred embodiments. But the more numerous the bars, the better the homogeneousness of the magnetic field.

The object of the invention can also be described as a transmission line (or a radio frequency wave guide) having multiple conductors, i.e. a transmission line which is constituted of a set of elementary conductors which are coupled with each other and with the shield which surrounds them, the elementary conductors corresponding to each rectilinear bar which is divided into cylindrical segments 1, these segments being electrically conductive or made electrically conductive, and each bar being provided with thin dielectric elements 2 which are inserted between the segments.

The invention described above is not limited to the embodiments described, or to the numerical values of the previous examples. The invention also relates to any similar type of device, with different dimensions and with adapted numerical values.

The invention claimed is:

1. A high frequency cavity resonator for nuclear magnetic resonance, comprising:
   a set of transmission lines; and
   a shield surrounding these transmission lines,
   wherein each of these transmission lines comprises a straight bar which is divided into elongated cylindrical segments, these segments being or being made electrically conducting, the bar being provided with thin solid dielectric elements disposed between the segments.

2. A high frequency cavity resonator according to claim 1, in which the cylindrical segments are made from a dielectric material whose external surface is made electrically conducting.

3. A high frequency cavity resonator according to claim 1, this cavity being provided with frequency tuning means, these tuning means being capable of modifying the thickness of the thin solid dielectric elements.

4. A high frequency cavity resonator according to claim 3, in which the thin solid dielectric elements are elastically deformable.

5. A high frequency cavity resonator according to claim 1, wherein the thin solid dielectric elements have a substantially circular cross section.

6. A high frequency cavity resonator according to claim 1, wherein the thin solid dielectric elements have a main surface which is substantially perpendicular to the bar axis.

7. A high frequency cavity resonator according to claim 1, in which the segments and the thin solid dielectric elements comprise drillings, each transmission line also comprising straight dielectric connecting parts that pass through the drillings and on which the segments and the thin solid dielectric elements can slide.

8. A high frequency cavity resonator according to claim 1, wherein the cylindrical segments and the thin solid dielectric elements of the same bar substantially have the same external diameter.

9. A high frequency cavity resonator according to claim 1, in which the transmission lines are substantially parallel and uniformly distributed on a cylindrical surface.

10. A high frequency cavity resonator according to claim 1, comprising two ends, one of which is open and the other is closed.

11. A high frequency cavity resonator according to claim 1, wherein the shield has a cylindrical structure.

12. A high frequency cavity resonator according to claim 10, in which the shield comprises a re-entrant part on the open end of the cavity resonator.

13. A high frequency cavity resonator according to claim 1, wherein an electrically conductive connection is established between each bar and the shield.

14. A high frequency cavity resonator according to claim 1, which is used in magnetic resonance imaging as a transmitting or receiving system.

15. A high frequency cavity resonator according to claim 1, which is used in the field of Magnetic Resonance Spectroscopy as a transmitting or receiving system.

16. A nuclear magnetic resonance device comprising the high frequency cavity resonator according to claim 1.

17. A multiple conductor wave guide, comprising:
a transmission line which is connected with elementary conductors,
wherein the elementary conductors are placed on a cylinder and an axes of the elementary conductors are substantially parallel to an axis of the cylinder, and
each of the elementary conductors comprises,
a rectilinear bar which is divided into elongated cylindrical segments, these segments being or being made electrically conductive, the bar being provided with thin solid dielectric elements which are disposed between the segments, the elementary conductors being conductively connected with a shield which surrounds the elementary conductors.

18. A high frequency cavity resonator according to claim 11, in which the shield comprises a re-entrant part on the open end of the cavity resonator.

19. A multiple conductor wave guide according to claim 18, wherein the elementary conductors include a set of transmission lines.

* * * * *